(12) United States Patent
Eaglesham et al.

(10) Patent No.: US 8,294,303 B2
(45) Date of Patent: Oct. 23, 2012

(54) PHOTOVOLTAIC GROUNDING

(75) Inventors: David Eaglesham, Perrysburg, OH (US); Christopher Thompson, Narragansett, RI (US); Michael Schenck, San Francisco, CA (US)

(73) Assignee: First Solar, Inc, Perrysburg, OH (US)

( * ) Notice: Subject to any disclaimer, the term of this patent is extended or adjusted under 35 U.S.C. 154(b) by 261 days.

(21) Appl. No.: 12/722,315

(22) Filed: Mar. 11, 2010

(65) Prior Publication Data
US 2011/0221274 A1 Sep. 15, 2011

(51) Int. Cl.
*H01H 71/08* (2006.01)
(52) U.S. Cl. ........................................ 307/112
(58) Field of Classification Search .............. 307/112
See application file for complete search history.

(56) References Cited

U.S. PATENT DOCUMENTS

| | | | |
|---|---|---|---|
| 5,712,572 A * | 1/1998 | Tamechika et al. ........... 324/551 |
| 6,593,520 B2 * | 7/2003 | Kondo et al. ................. 136/244 |
| 6,884,934 B2 | 4/2005 | Tsuzuki et al. |
| 2001/0040453 A1 | 11/2001 | Toyomura et al. |
| 2008/0106425 A1 | 5/2008 | Deaver et al. |
| 2009/0207543 A1 | 8/2009 | Boniface et al. |
| 2009/0212629 A1 * | 8/2009 | Paull ............................ 307/60 |
| 2009/0217964 A1 | 9/2009 | Gilmore et al. |
| 2010/0085670 A1 * | 4/2010 | Palaniswami et al. .......... 361/42 |
| 2010/0269889 A1 * | 10/2010 | Reinhold et al. .............. 136/251 |

* cited by examiner

*Primary Examiner* — Adi Amrany
(74) *Attorney, Agent, or Firm* — Dickstein Shapiro LLP

(57) ABSTRACT

Embodiments disclosed include photovoltaic power systems and methods for manufacturing the same. A photovoltaic power system can include a photovoltaic array, a DC to AC inverter, a positive conductor electrically connecting a positive inverter terminal of the DC to AC inverter to the positive array terminal and a negative conductor electrically connecting a negative inverter terminal of the DC to AC inverter to the negative array terminal, a positive-conductor ground electrically connected by a switch to the positive conductor, and a negative-conductor ground electrically connected by a switch to the negative conductor.

12 Claims, 3 Drawing Sheets

PHOTOVOLTAIC GROUNDING

TECHNICAL FIELD

This invention relates to a photovoltaic power system with improved grounding.

BACKGROUND

Photovoltaic arrays can generate DC voltages as high as 600-1000V. Under typical conditions, the DC cabling for these arrays is physically protected in metal conduit and also includes fused thermal protection as well.

DETAILED DESCRIPTION

Figure 1:
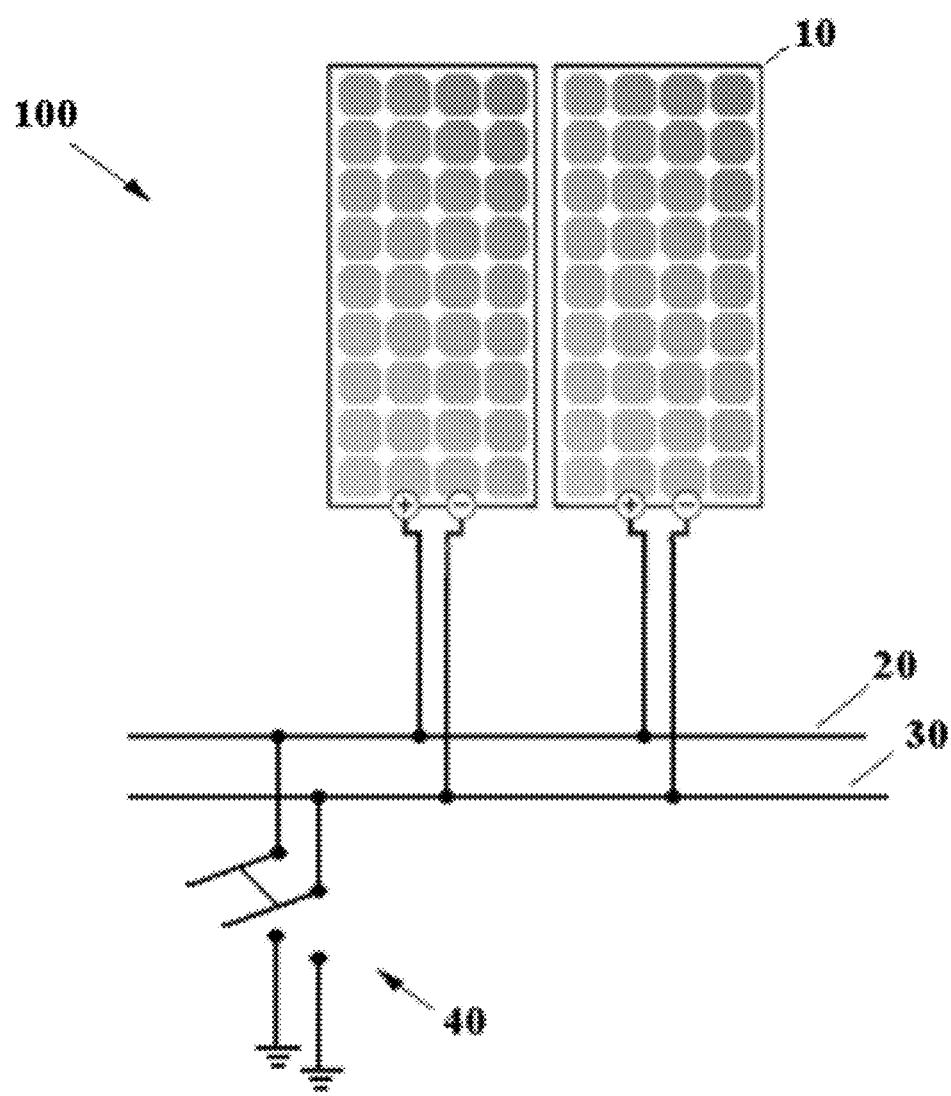
FIG. 1 is a diagram illustrating the connection of a photovoltaic power system.

Photovoltaic (PV) arrays can generate DC voltages as high as 600-1000V. Under typical conditions, the direct current (DC) cabling for these arrays is physically protected in metal conduit and also includes fused thermal protection as well. Under emergency conditions, such as a fire, it may be desirable on rooftop installations to cut through both the metal conduit and cabling to provide access to the building. Because PV modules generate power based on solar irradiation, the DC cable is typically at operating voltage, or higher, even after both external power to the building and the inverter are turned off. To reduce this DC voltage on the cabling, for example, to reduce or minimize the electrical potential of the conductors, a photovoltaic power system with improved grounding is described.

In one aspect, a photovoltaic power system can include a photovoltaic array including a plurality of electrically connected photovoltaic modules and a positive array terminal and negative array terminal to conduct the current produced by the photovoltaic array. The photovoltaic power system can include a DC to AC inverter. The photovoltaic power system can include a positive conductor electrically connecting a positive inverter terminal of the DC to AC inverter to the positive array terminal and a negative conductor electrically connecting a negative inverter terminal of the DC to AC inverter to the negative array terminal. The photovoltaic power system can include a positive-conductor ground electrically connected by a switch to the positive conductor and a negative-conductor ground electrically connected by a switch to the negative conductor.

The positive conductor can include a positive combiner terminal located in a combiner box between the photovoltaic array and the inverter and the negative conductor can include a negative combiner terminal located in the combiner box. The positive-conductor ground and negative-conductor ground can be located between the photovoltaic array and the combiner box. The photovoltaic power system can include a second positive conductor ground connected to the positive conductor and a second negative-conductor ground connected to the negative conductor, at the combiner box.

The photovoltaic power system can include a third positive conductor ground connected to the positive conductor and a third negative-conductor ground connected to the negative conductor, at the inverter. The connection between the positive-conductor ground and the positive conductor and the negative-conductor ground and the negative conductor is located at the combiner. The connection between the positive-conductor ground and the positive conductor and the negative-conductor ground and the negative conductor is located at the inverter.

The switch connecting the positive-conductor ground to the positive conductor is the same switch connecting the negative-conductor ground to the negative conductor. At least one switch can include an electromechanical device. At least one switch can include a semiconductor device. At least one switch can include a manually activated switch. At least one switch can include a remotely activated switch. At least one switch can include an automatically activated switch.

In another aspect, a method of manufacturing a photovoltaic power system can include electrically connecting a photovoltaic array including a plurality of photovoltaic modules to a DC to AC inverter to conduct the current produced by the photovoltaic array. Connecting the photovoltaic array to the DC to AC inverter can include electrically connecting a positive array terminal of the photovoltaic array to a positive inverter terminal of the DC to AC inverter with a positive conductor and a negative array terminal of the photovoltaic array to a negative inverter terminal of the DC to AC inverter with a negative conductor. The method can include electrically connecting a positive-conductor ground to the positive conductor. The method can include electrically connecting a negative-conductor ground to the negative conductor.

The step of electrically connecting a positive-conductor ground to the positive conductor can include connecting a switch between the positive conductor and the positive-conductor ground. The step of electrically connecting a negative-conductor ground to the negative conductor can include connecting a switch between the negative conductor and the negative-conductor ground.

The step of electrically connecting a positive array terminal to a positive inverter terminal with a positive conductor can include connecting the positive conductor from the positive array terminal to a positive combiner terminal in a combiner box and from the positive combiner terminal to the positive inverter terminal and the step of electrically connecting a negative array terminal to a negative inverter terminal with a negative conductor can include connecting the negative conductor from the negative array terminal to a negative combiner terminal in the combiner box and from the negative combiner terminal to the negative inverter terminal.

The positive-conductor ground can be connected to the positive conductor and the negative-conductor ground can be connected to the negative conductor, at the combiner. The positive-conductor ground can be connected to the positive conductor and the negative-conductor ground can be connected to the negative conductor, at the inverter.

Referring to FIG. 1, solar power system 100 can include a photovoltaic array including least one photovoltaic module 10. Solar modules 10 can be arranged in any suitable manner, for example, in arrays positioned on the ground or on rooftops. Solar modules 10 can include any suitable photovoltaic devices, including thin-film solar devices such as cadmium telluride (CdTe) or copper indium gallium selenide (CIGS). Alternatively, the photovoltaic devices can be crystalline silicon solar devices or any other suitable photovoltaic devices capable of generating direct current electricity. DC electric current generated by photovoltaic module 10 can output to a pair of positive and negative conductors (20 and 30 in FIG. 1). Switch 40 can be used for electrically connecting the pair of positive and negative conductors to ground.

Figure 2:
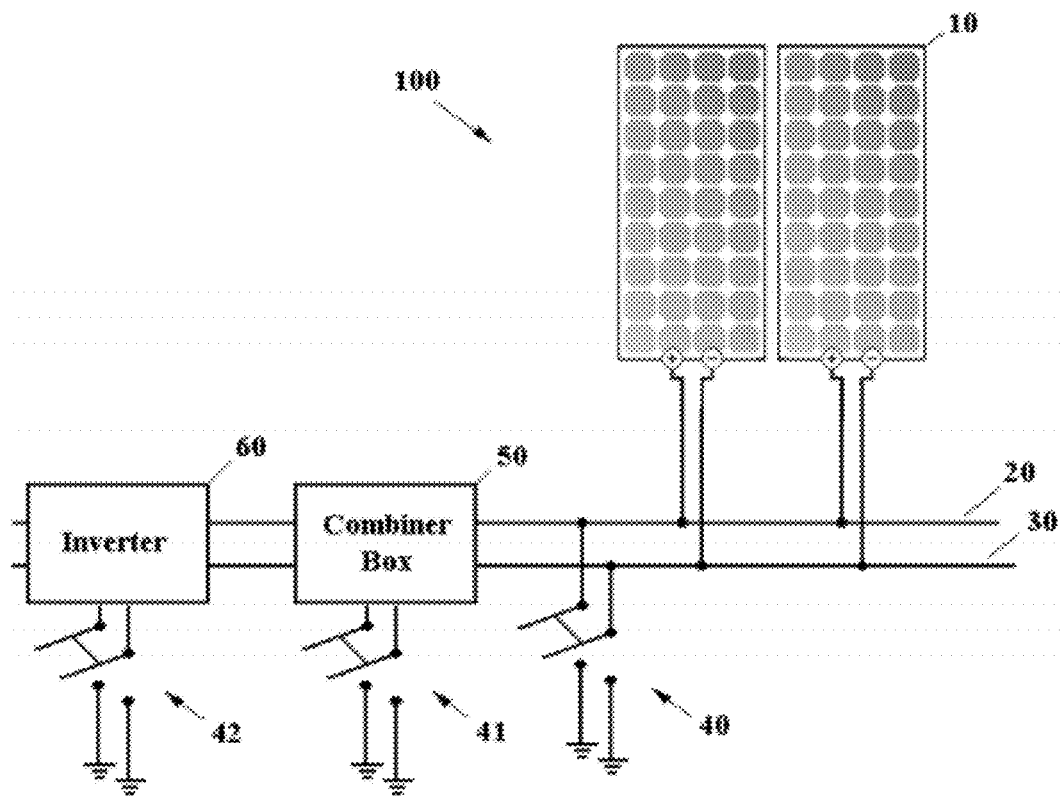
FIG. 2 is a diagram illustrating the connection of a photovoltaic power system.

Referring to FIG. 2, solar power system 100 can further include combiner box 50 and DC to AC inverter 60. DC to AC inverter 60 can be used in solar module-based power system 100 to convert direct current (DC) from a photovoltaic array into alternating current (AC) for use with home appliances or an alternating-current utility grid. DC to AC inverter 60 can include any suitable apparatus or combination which can convert DC current from a photovoltaic array to AC current. DC to AC inverter 60 can include any suitable mechanical device, electromechanical device, electrical or electronic device, or any suitable combination thereof. DC to AC inverter 60 can include a modified sine wave inverter. DC to AC inverter 60 can include a pure sine wave inverter. DC to AC inverter 60 can include a generator, alternator, or motor, or any suitable combination thereof. DC to AC inverter 60 can include a solid-state inverter.

Combiner box 50 can be similar to a junction box. The conductors (20 and 30 in FIG. 2) used to wire the PV array come into combiner box 50. The conductors can be connected via a power distribution block to the larger conductors that run to inverter 60, or charge controller/batteries. The goal is to carry the electrical energy from the PV array to the batteries/power grid with a minimum of voltage drop.

In some embodiments, combiner box 50 can also permit the combining of multiple photovoltaic source circuits (sub-arrays, panels, or series strings), and provide a method of removing a module or subarray/panel from the array without interrupting the rest of the array.

Combiner box 50 can be electrically connected to the pair of positive and negative conductors 20 and 30. Switch 41 can be included for electrically connecting the output/input of combiner box 50 to ground. DC to AC inverter 60 can be electrically connected to combiner box 50. DC to AC inverter 60 can included for converting the DC output from photovoltaic module 10 to AC current. Switch 42 can be included for electrically connecting the DC to AC inverter to ground.

As shown in FIG. 2, solar power system 100 can include grounding both the positive and negative conductors (20 and 30 in FIG. 2) of the PV array and therefore minimizing any residual voltage on the DC cabling. Positive conductor 20 can be connected to a positive-conductor ground. The connection can be made through a first electrical switch. Negative conductor 30 can be connected to a negative-conductor ground. The connection can be made through a second electrical switch. Such grounding can be done both at inverter 60 and PV combiner box 50 within solar power system 100. In some embodiments, the grounding can be achieved through electromechanical devices such as contactors or relays. In other embodiments, the grounding can be achieved through solid state devices (such as an insulated gate bipolar transistor (IGBT), a thyristor, or silicon-controlled rectifier (SCR), or any other suitable apparatus or combination. The grounding can be manual activated at the inverter or combiner box, remote activated through a communications network, or automatic activated by a timing device.

Figure 3:
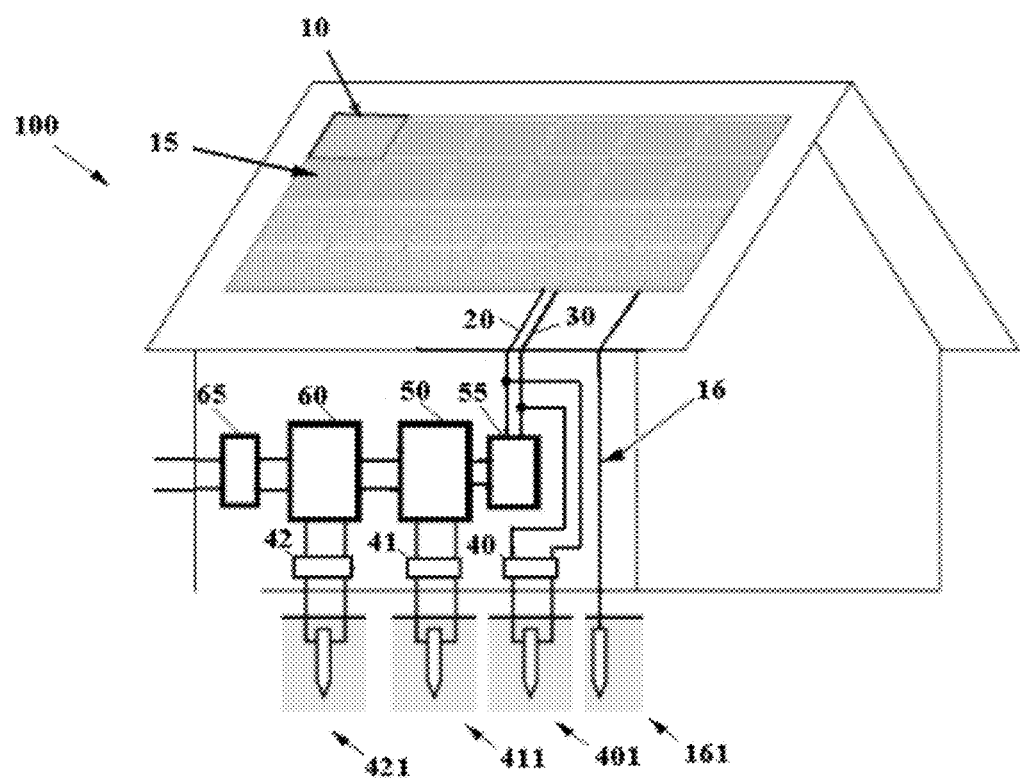
FIG. 3 is a diagram illustrating the connection of a photovoltaic power system.

FIG. 3 further includes a graphical representation of how solar power system 100 can be installed with improved grounding in a practical setting (e.g. rooftop). There are a number of issues which should be considered during grounding a solar power system for a photovoltaic (PV) installation. There are multiple sources to follow, such as installation instructions, industry practices, and the National Electrical Code®. Solar power system 100 can include any suitable number of ground connections between the photovoltaic array 15 and inverter 60. For example, system 100 can include the ground connection associated with switch 40 alone, or in combination with one or more ground connections, such as the ground connections associated with switches 41 and 42. Each of these grounds, individually, is optional to system 100.

Solar power system 100 can include at least one photovoltaic module 10. Solar modules 10 can be arranged in any suitable manner, for example, in array 15 positioned on rooftops. DC electric current generated by photovoltaic module 10 can output to a pair of positive and negative conductors (20 and 30 in FIG. 1). Switch 40 can be used for electrically connecting the pair of positive and negative conductors to ground electrode 401. Ground wire 16 can be used to connect the frame or structure of array 15 to ground electrode 161 for lightening protection.

Solar power system 100 can further include DC fuse box 55, combiner box 50, DC to AC inverter 60, and AC fuse box 65. Switch 41 can be included for electrically connecting the output/input of combiner box 50 to ground electrode 411. DC to AC inverter 60 can included for converting the DC output from photovoltaic array 15 to AC current. Switch 42 can be included for electrically connecting DC to AC inverter 60 to ground electrode 421.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A photovoltaic power system comprising:
 a photovoltaic array comprising a plurality of electrically connected photovoltaic modules and a positive array terminal and negative array terminal to conduct the current produced by the photovoltaic array;
 a combiner box;
 a DC to AC inverter;
 a positive conductor electrically connecting a positive inverter terminal of the DC to AC inverter to the positive array terminal;
 a negative conductor electrically connecting a negative inverter terminal of the DC to AC inverter to the negative array terminal; and
 a first positive-conductor ground electrically connected by a switch to the positive conductor at the combiner box;
 a first negative-conductor ground electrically connected by a switch to the negative conductor at the combiner box;
 a second positive-conductor ground electrically connected by a switch to the positive conductor at the inverter; and
 a second negative-conductor ground electrically connected by a switch to the negative conductor at the inverter.

2. The photovoltaic power system of claim 1, wherein the switch connecting the first positive-conductor ground to the positive conductor is the same switch connecting the first negative-conductor ground to the negative conductor.

3. The photovoltaic power system of claim 1, wherein at least one switch comprises an electromechanical device.

4. The photovoltaic power system of claim 1, wherein at least one switch comprises a semiconductor device.

5. The photovoltaic power system of claim 1, wherein at least one switch comprises a manually activated switch.

6. The photovoltaic power system of claim 1, wherein at least one switch comprises a remotely activated switch.

7. The photovoltaic power system of claim 1, wherein at least one switch comprises an automatically activated switch.

8. The photovoltaic power system of claim 1, wherein the switch connecting the second positive-conductor ground to the positive conductor is the same switch connecting the second negative-conductor ground to the negative conductor.

9. A photovoltaic power system comprising:
a photovoltaic array comprising a plurality of electrically connected photovoltaic modules and a positive array terminal and negative array terminal to conduct the current produced by the photovoltaic array;
a DC to AC inverter;
a positive conductor electrically connecting a positive inverter terminal of the DC to AC inverter to the positive array terminal and a negative conductor electrically connecting a negative inverter terminal of the DC to AC inverter to the negative array terminal, wherein the positive conductor comprises a positive combiner terminal located in a combiner box between the photovoltaic array and the inverter and the negative conductor comprises a negative combiner terminal located in the combiner box; and
a positive-conductor ground electrically connected by a switch to the positive conductor and a negative-conductor ground electrically connected by a switch to the negative conductor, wherein the positive-conductor ground and negative-conductor ground are located between the photovoltaic array and the combiner box; and
a second positive conductor ground switchably connected to the positive conductor and a second negative-conductor ground switchably connected to the negative conductor, at the combiner box.

10. The photovoltaic power system of claim 9, further comprising a third positive conductor ground switchably connected to the positive conductor and a third negative-conductor ground switchably connected to the negative conductor, at the inverter.

11. A method of manufacturing a photovoltaic power system comprising:
electrically connecting a photovoltaic array comprising a plurality of photovoltaic modules to a DC to AC inverter and a combiner box to conduct the current produced by the photovoltaic array, comprising: electrically connecting a positive array terminal of the photovoltaic array to a positive combiner terminal of the combiner box and a positive inverter terminal of the DC to AC inverter with a positive conductor, and electrically connecting a negative array terminal of the photovoltaic array to a negative combiner terminal of the combiner box and a negative inverter terminal of the DC to AC inverter with a negative conductor; and
electrically and switchably connecting a first positive-conductor ground to the positive conductor at the combiner box;
electrically and switchably connecting a first negative-conductor ground to the negative conductor at the combiner box;
electrically and switchably connecting a second positive-conductor ground to the positive conductor at the combiner box; and
electrically and switchably connecting a second negative-conductor ground to the negative conductor at the combiner box.

12. The method of claim 11, wherein the step of electrically and switchably connecting at least one of the first and second positive-conductor ground to the positive conductor comprises connecting a switch between the positive conductor and the positive-conductor ground, and wherein the step of electrically and switchably connecting at least one of the first and second negative-conductor ground to the negative conductor comprises connecting a switch between the negative conductor and the negative-conductor ground.

* * * * *